United States Patent
Diekmann

(10) Patent No.: US 7,521,856 B2
(45) Date of Patent: Apr. 21, 2009

(54) OLED DEVICE

(75) Inventor: Karsten Diekmann, Rattenberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 462 days.

(21) Appl. No.: 11/292,038

(22) Filed: Nov. 30, 2005

(65) Prior Publication Data

US 2006/0163591 A1    Jul. 27, 2006

Related U.S. Application Data

(60) Provisional application No. 60/647,591, filed on Jan. 26, 2005.

(51) Int. Cl.
*H01L 51/50* (2006.01)
*H01L 51/54* (2006.01)

(52) U.S. Cl. .................. 313/504; 313/501; 313/503; 313/506; 428/690

(58) Field of Classification Search ......... 313/500–512; 428/690
See application file for complete search history.

(56) References Cited

U.S. PATENT DOCUMENTS

| | | | |
|---|---|---|---|
| 6,066,861 A | 5/2000 | Höhn et al. | |
| 6,072,450 A * | 6/2000 | Yamada et al. | 313/500 |
| 6,133,692 A | 10/2000 | Xu et al. | |
| 6,454,966 B1 * | 9/2002 | Kobayashi et al. | 313/501 |
| 7,294,439 B2 * | 11/2007 | Kawaguchi et al. | 430/7 |
| 2001/0043043 A1 * | 11/2001 | Aoyama et al. | 313/506 |
| 2004/0012331 A1 * | 1/2004 | Yamazaki et al. | 313/506 |
| 2007/0115221 A1 * | 5/2007 | Buchhauser et al. | 345/76 |

OTHER PUBLICATIONS

C.C. Wu et al., "Integration of Organic LED's and Amorphous Si TFT's onto Flexible and Lightweight Metal Foil Substrates", IEEE Electron Device Letters, vol. 18, No. 12, pp. 609-612, Dec. 1997.
Dirk Buchhauser et al., "Characterization of white emitting copolymers for PLED-displays", Proc. of SPIE, vol. 5519, pp. 70-81 (2004).

* cited by examiner

*Primary Examiner*—Mariceli Santiago
(74) *Attorney, Agent, or Firm*—Cohen Pontani Lieberman & Pavane LLP

(57) ABSTRACT

An organic light-emitting device (OLED) comprising an organic active region which emits electromagnetic radiation, a conversion material which converts a portion of the radiation into light of a certain spectral range, and a filter material which transmits said light.

24 Claims, 4 Drawing Sheets

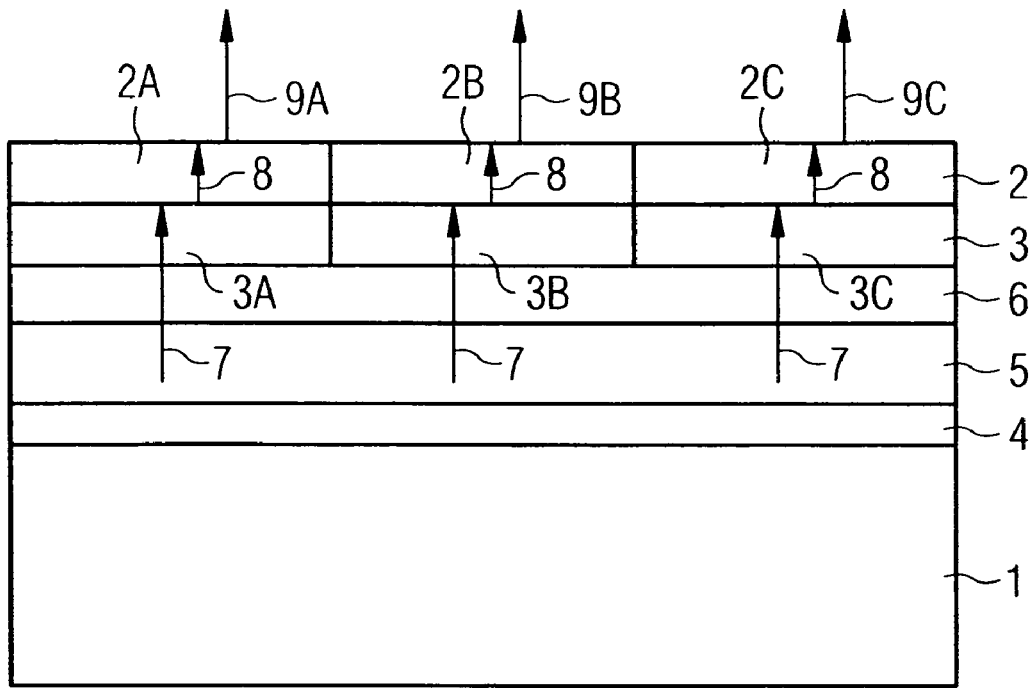
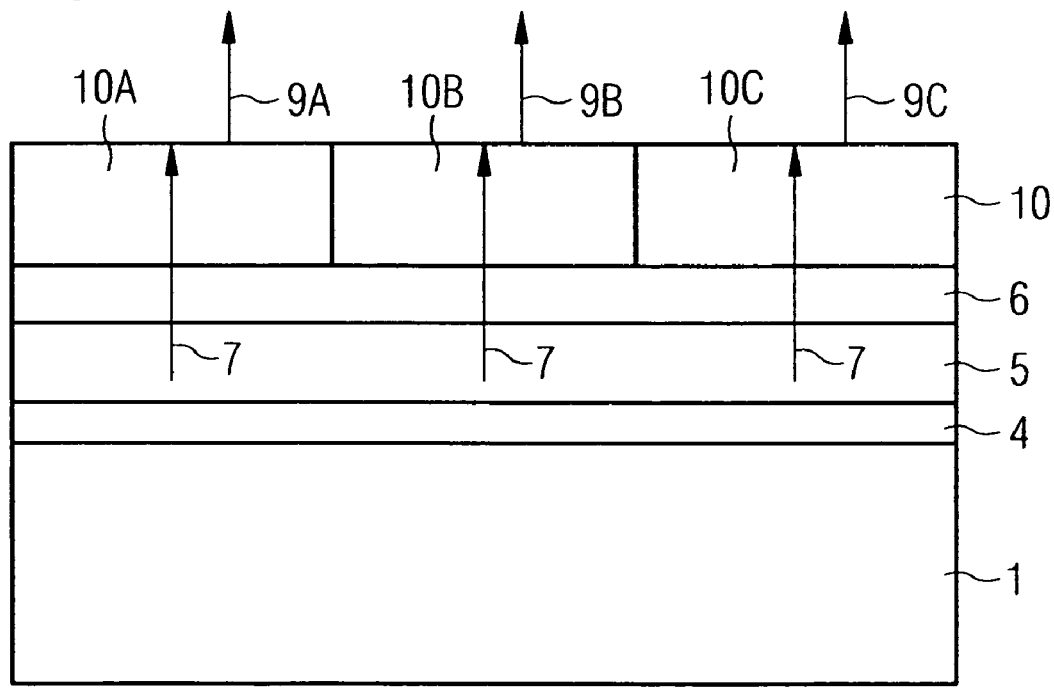

OLED DEVICE

RELATED APPLICATIONS

This application claims priority from U.S. Provisional Patent Application Ser. No. 60/647,591 which was filed on Jan. 26, 2005.

FIELD OF THE INVENTION

The present invention relates to an organic light-emitting device (OLED).

BACKGROUND OF THE INVENTION

U.S. Pat. No. 6,133,692 discloses a white light generating electroluminescent device with an organic light emitting diode.

SUMMARY OF THE INVENTION

One object of the present invention is to provide an OLED device which is capable of producing light with high efficiency.

According to an embodiment of the OLED device, the device comprises an organic active region which is capable of emitting electromagnetic radiation. For example, the active region comprises an electrically conducting hole transporting material and an emissive organic polymer material. It is also possible that the active region comprises small organic molecules for producing electromagnetic radiation.

The organic active region can emit electromagnetic radiation of a broad spectral range when treated with electrical current. For example, the organic active region is capable of producing white light which means that the organic active region emits, for example, radiation in a wavelength range between about 400 nm and 750 nm. To the human eye, the emitted light mixes to produce white light.

According to another embodiment of the OLED device, the OLED comprises a material which converts a portion of the radiation emitted by the active region into light of a certain spectral range. The term "portion of radiation" means a certain wavelength or a certain range of wavelengths of the radiation produced in the active region. Thus, electromagnetic radiation produced in the active layer of a certain wavelength or a certain range of wavelengths is absorbed by the converter material and light of another wavelength or another range of wavelengths is re-emitted by the converter material.

For example, the converter material is excited by a spectral part of the incident radiation and re-emits radiation with other wavelengths, e.g. with longer wavelengths. For example, the converter material comprises at least one of the following materials: inorganic phosphors, organic dyes, Ce-doped garnets (like YAG:Ce, TAG:Ce, TbYAG:Ce), Tb-doped garnets, alkaline earth sulfates. Suitable color-conversion materials are described, for example, in U.S. Pat. No. 6,066,861, which is hereby incorporated by reference.

According to another embodiment of the OLED device, the OLED device comprises a filter material. The filter material can transmit radiation of a certain spectral range. The spectral range can comprise the electromagnetic radiation converted by the converter material; that is to say, the filter material lets at least electromagnetic radiation of the spectral range pass to which the converter material converts a portion of the radiation originally emitted by the active region. The remaining radiation can be absorbed by the filter material, at least for the most part. For example, the filter material comprises at least one kind of pigment which transmit light of a certain spectral range of electromagnetic radiation while the remainder of the radiation is absorbed by the pigments.

According to another embodiment of the OLED device, the device comprises an organic active region which emits electromagnetic radiation, a converter material which converts a portion of the radiation into light of a certain spectral range and a filter material which transmits at least said light.

According to another embodiment of the OLED device, the converter material converts a portion of the radiation emitted by the active region into light of the red spectral range and the filter material transmits light of the red spectral range. The light of the red spectral range comprises light which appears red to the human eye. The red spectral range can comprise electromagnetic radiation with a maximum of its intensity in a range of wavelengths between 620 and 780 nm, in particular light in the wavelength range between 630 and 670 nm.

According to another embodiment of the OLED device, the converter material converts radiation in the blue spectral range to light of the red spectral range; that is to say the radiation emitted by the active region comprises light of the blue spectral range and the converter material is capable of converting this light into light of the red spectral range. The blue spectral range can comprise light with a maximum of its intensity in a range of wavelengths between 450 and 490 nm.

The filter can transmit the red light re-emitted by the converter material. In case the active region emits radiation of a broad spectral range, e.g. white light, the converter material is capable of converting the blue portion of the emitted radiation to light of the red spectral range and the filter material transmits both the red portion of the originally emitted radiation and the red light re-emitted by the converter material. The remainder of the white light can be absorbed by the filter material resulting in an OLED device which emits light of the red spectral range.

According to another embodiment of the OLED device, the converter material converts radiation in the green spectral range to light of the red spectral range. The green spectral range can comprise light with a maximum of its intensity in a range of wavelengths between 490 and 580 nm. The filter material can be capable of transmitting the thus produced red light. In case the active region emits radiation of a broad spectral range, e.g. white light, the filter material can transmit both the red light produced by the converter material and the red light portion of the originally emitted radiation. In this case, the OLED device is capable of emitting red light.

According to another embodiment of the OLED device, the converter material converts light of the blue and the green spectral range to light of the red spectral range. The converter material can be capable of converting light of shorter wavelengths to light of the red spectral range. For example, light in the spectral range comprising wavelengths from 380 to 650 nm is converted to red light.

According to another embodiment of the OLED device, the OLED device comprises a converter material which converts a portion of the radiation emitted by the active region to light of the green spectral range. The converter material can at least convert light of the blue spectral range to light of the green spectral range. The blue spectral range comprises, for example, light with a maximum of its intensity in a range of wavelengths between 450 and 490 nm. The green light comprises light with a maximum of its intensity in a range of wavelengths between 490 and 580 nm.

The filter material can transmit the thus produced green light. In case the active region emits broad radiation, e.g. white light, the filter material transmits both the green light portion originally emitted by the active region and the green light produced by the described conversion process. The OLED device then emits green light.

According to another embodiment of the OLED device, the converter material converts light of shorter wavelengths to light of the green spectral range.

In all implementations, the spectral range of the emitted light can be tuned by adapting converter and/or filter material accordingly. Furthermore, it is possible that invisible radiation, e.g. ultraviolet radiation, is converted to light in the visible range by means of the converter material. Also, the production of light of other colors than the described ones is possible. For example, a portion of the radiation emitted by the active region can be converted to light of the yellow spectral range. In this case, the filter material is adapted to transmit the thus produced yellow light along with the yellow portion of the originally produced radiation.

According to another embodiment of the OLED device, the OLED device comprises a plurality of pixels. This means that the OLED device comprises a plurality of light-emitting elements. The pixels can be capable of producing electromagnetic radiation independently from each other; that is to say every pixel can be driven independently from the remaining pixels of the device. Each pixel can comprise an organic active region for the production of electromagnetic radiation, a converter material which converts a portion of the radiation into light of a certain spectral range and a filter material which transmits that light. Thus, the pixel can produce light of a certain color, as explained above. Different pixels may comprise different converter and different filter materials. Therefore, different pixels can produce light of different colors.

According to another embodiment of the OLED device, each pixel comprises at least two sub-pixels. Each sub-pixel can comprise an organic active region which is capable of emitting electromagnetic radiation, a conversion material which converts a portion of the radiation into light of a certain spectral range and a filter material which transmits that light. Depending on the filter and converter materials that are used, different sub-pixels of the same pixel can emit light of different colors. The sub-pixels of a pixel can be capable of emitting light independently from each other. This means that every sub-pixel can be driven independently from the remaining sub-pixels of the device. Thus, the sub-pixels of a pixel can produce light sequentially or simultaneously.

According to another embodiment of the OLED device, at least one of the sub-pixels emits light in the red spectral range; that is to say the maximum of intensity of the emitted light is in a range of wavelengths between 620 and 780 nm, in particular between 630 and 670 nm. For example, the active region of the sub-pixel produces white light, the converter material converts a portion of the white light to red light and the filter material lets the thus produced red light and the red light portion originally contained in the white light pass. The remaining portion of the radiation is, at least for the most part, absorbed by the filter material.

According to another embodiment of the OLED device, at least one of the sub-pixels emits light in the green spectral range. This means that the light produced by this sub-pixel comprises electromagnetic radiation with a maxmium of its intensity between 490 and 580 nm, in particular between 490 and 530 nm.

For example, the converter material converts at least a portion of the radiation produced in the active region into light of the green spectral range. The filter material then transmits the thus produced green light and the green portion of the originally produced radiation. The remaining radiation can be absorbed by the filter material.

According to another embodiment of the OLED device, at least one sub-pixel emits light in the blue spectral range. This means that the sub-pixel emits radiation with a maximum of its intensity between 450 and 490 nm. For example, the sub-pixel comprises an active region which emits radiation of a broad spectrum, e.g. white light and a filter material which mostly transmits light of the blue spectral range. Alternatively, the sub-pixel can, in addition to the filter material, comprise a converter material which is capable of converting radiation of shorter wavelengths, e.g. in the violet or ultraviolet spectral range to light in the blue spectral range. The filter material then also transmits the thus produced blue light.

With pixels comprising at least one red, one blue and one green emitting sub-pixel a full-color display can be built. Full color means the region of the CIE chromaticity diagram, which is spanned by the three color vectors red, green and blue.

According to another embodiment of the OLED device, each sub-pixel of the OLED device comprises a substrate, a first electrode formed over the substrate, the organic active region formed over the first electrode and a second electrode formed over the organic material.

According to another embodiment of the OLED device, the converter material is located between the substrate and the first electrode in the sub-pixel. In this case, emission of light is preferentially through the substrate. As explained above, a portion of the radiation produced in the active region is converted to light of a certain spectral range and passing through the converter material.

According to another embodiment of the OLED device, the filter material is located between the substrate and the first electrode in the sub-pixel. Emission of light is then preferentially through the substrate. The radiation passes through the filter material before leaving the device and, as explained above, mostly light of a certain spectral range is transmitted by the filter material. In case the sub-pixel also comprises a converter material, the filter material can be located between the substrate and the converter material. This arrangement of filter material and converter material results in a device where radiation emitted by the active region of the sub-pixel passes through the converter material where a portion of the radiation is converted to light of a certain spectral range, and at least part of this light passes through the filter material.

One possible alternative to the above-described directional arrangement of filter and converter material, filter and converter material can be arranged in an unordered way. For example, particles of the converter material and particles of the filter material can be mixed into a shared matrix material. The thusly formed combined converter/filter material is, for example, located between the substrate and the first electrode.

According to another embodiment of the OLED device, the converter material is formed over the second electrode of the pixel. In this case, emission of light is preferably through the second electrode. Consequently, light passing through the second electrode is at least partially converted by the converter material, as explained above.

According to another embodiment of the OLED device, the filter material is formed over the second electrode. The filter material transmits light of a certain spectral range. The remainder of the radiation is, at least for the most part, absorbed by the filter material. In case the sub-pixel also comprises a converter material, the converter material is, according to at least one implementation of the device, arranged between the second electrode and the filter material. Hence, radiation emitted by the active region passes through the second electrode, a portion of the radiation is converted to light of a certain spectral range and the filter material transmits mostly only light of said spectral range.

According to at least one alternative implementation to the above-described sequence of converter and filter material, the converter and filter material can be arranged in an unordered way. For example, particles of filter and converter material are mixed into a shared matrix material. The combined converter/filter material is, for example, formed over the second electrode.

According to another embodiment of the OLED device, the sub-pixel comprises a switching element. Each sub-pixel can comprise a switching element. The switching element is capable of controlling the current flowing through the active region of the sub-pixel. For example, production of radiation in the active region can be switched on or off by means of the switching element. Furthermore, it is possible that the amount of current flowing through the active region can be controlled by means of the switching element. In this way the intensity of the produced radiation can be controlled by means of the switching element.

According to another embodiment of the device, the switching element comprises at least one thin film transistor (TFT).

BRIEF DESCRIPTION OF THE DRAWINGS

FIG. 3 shows a schematic sectional view of a third exemplary embodiment of an OLED device.

FIG. 4 shows a schematic sectional view of a fourth exemplary embodiment of an OLED device.

DETAILED DESCRIPTION OF THE DRAWINGS

Figure 1:
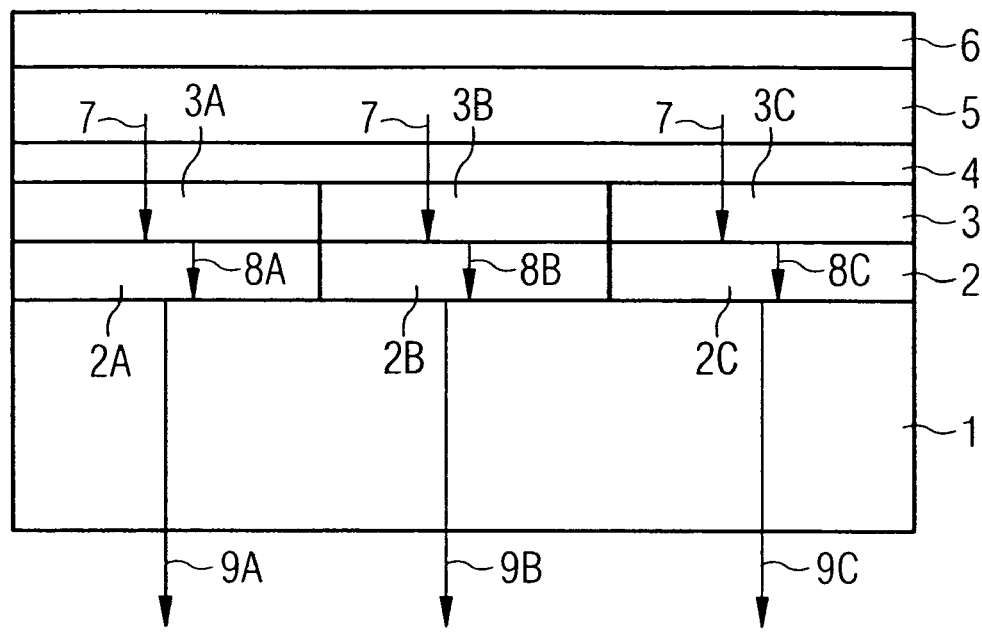
FIG. 1 shows a schematic sectional view of a first exemplary embodiment of an OLED device.

FIG. 1 shows a schematic sectional view of a first exemplary embodiment of the OLED device. The OLED device comprises an active region 5. For example the active region 5 comprises one or more layers of a material which is capable of emitting electromagnetic radiation 7. The active region 5 can comprise at least one organic material that emits radiation—preferentially white light 7.

For example, polymers are utilized in the active region. The polymers may be organic or organometallic in nature.

The polymers can be solvated in an organic solvent such as toluene or xylene. For example, the polymers are spin-coated onto the device. Other solution-based coating techniques, like doctorblading or printing, are also possible.

For example, the polymers comprise first chromophors which produce a green color impression and second chromophors which produce a red color impression. For example, the chromophors are admixed to the polymer or are covalent bonded to the polymers. Polymers can be utilized which emit radiation in the blue spectral range. To these polymers red and green-emitting chromophors are covalent bonded resulting in white-emitting co-polymers. Such co-polymers can be built up of a blue-emitting backbone of polyspirobifluorenen with covalently coupled red- and green-emitting structural elements. Such a broad band emitter based on co-polymers is described, for example, in further detail by: D. Buchhauser et al., "Characterization of White-Emitting Copolymers for PLED-Displays", Proc. of SPIE", Vol. 5519, pp. 70-81, (2004), which is hereby incorporated by reference.

Furthermore, the polymers can comprise chromophors which produce a blue color impression of the emitted radiation. By means of these additional blue chromophors it is possible to tune the color rendering index and the color temperature of the emitted white light 7 in a well-defined way.

Instead of polymers the active region 5 can comprise small organic molecules. In this case the active region can, for example, be produced by vacuum evaporation techniques.

Furthermore, the active region can comprise at least one hole injection layer. The hole injection layer is suited to reduce the injection barrier for introducing holes into the active organic material. Furthermore, the active region may comprise one or more hole transportation layers and one or more electron transportation layers which promote transportation of holes and electrons, respectively.

In the embodiment shown in FIG. 1 the active region 5 is sandwiched between first electrode 4 and second electrode 6.

In one configuration of the device, the first electrode 4 functions as an anode. The electrode 4 can form an electrical contact with ohmic characteristics to the active region 5. If the first electrode 4 acts as an anode it is able to inject holes into the active region 5. The first electrode 4 can show a high work function for electrons. The anode can comprise at least one of the following materials: platinum, gold, palladium, indium, lead-oxide, tin-oxide, indium-tin-oxide (ITO), graphite, silicone, germanium, galliumarsenide, polyaniline, polypyrol, polythiophene or in general suitable metals, metal-oxides, doped inorganic semiconductors and doped conducting polymers.

The first electrode 4 can be transparent, semitransparent or opaque to the radiation generated within the active region 5. In the embodiment shown in FIG. 1, the first electrode can be, at least for the most part of the radiation 7 produced in the active region 5, transparent. In an alternative configuration of the device it is also possible that the first electrode 4 functions as a cathode. Suitable cathode materials will be given in connection with the description of the second electrode 6.

In one configuration of the device the second electrode 6 functions as a cathode. In order to minimize the injection barrier for electrons, the second electrode 6 then shows a low work function for electrons. The cathode can comprise at least one of the following materials: aluminum, indium, silver, gold, magnesium, calcium, barium. The thickness of the second electrode 6 can be from 1 to 1000 nm, more preferably about 50 to about 500 nm and most preferably from about 100 to 300 nm. In an alternative configuration of the device the second electrode 6 can act as an anode. Suitable anode materials are given above in connection with the description of the first electrode.

Both first and second electrodes can be, for example, applied by one of the following techniques: vacuum evaporation, sputtering, electron beam deposition, chemical vapor deposition.

According to the exemplary embodiment shown in FIG. 1, electromagnetic radiation 7, which can be white light, produced in the active region 5 passes through the first electrode 4 into a layer or layer stack forming the converter region 3.

The converter region 3, for example, comprises at least one color-changing medium or converter material. The color-changing medium is excited by at least one spectral part of the incident radiation 7, and thus re-emits light with other wavelengths. For example, the thusly produced light has longer wavelengths than the part of the radiation 7 converted by the converter material. For example, the converter region 3 comprises at least one of the following materials: inorganic phosphors, organic dyes, Ce-doped garnets (like YAG:Ce, TAG:Ce, TbYAG:Ce), Tb-doped garnets, alkaline earth sulfates.

Figure 5:
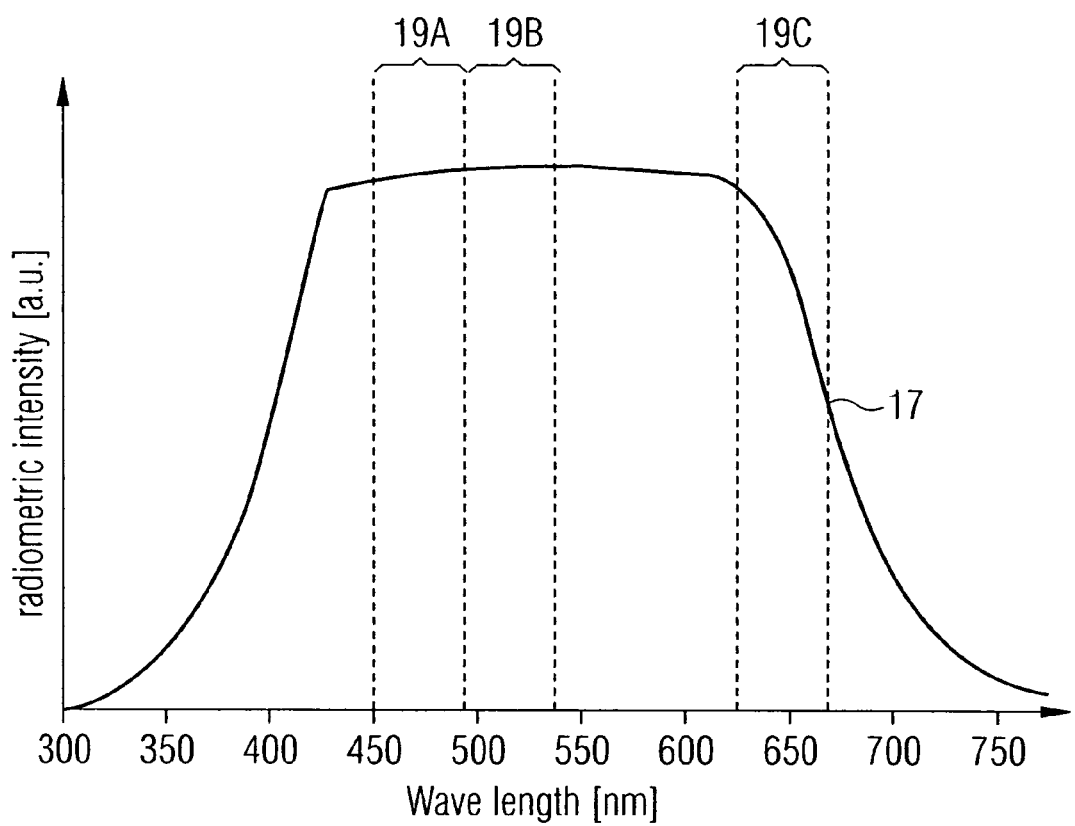
FIG. 5 shows a schematic electroluminescence spectrum of the radiation emitting by active material of the OLED device.

FIG. 5 explains the conversion process in more detail. FIG. 5 shows an electroluminescence spectrum of the radiation 7 emitted by the active region 4. In FIG. 5, the spectral range 17 of the produced white light is shown schematically. The white light comprises radiation of wavelengths between about 300 and 800 nm. For example, radiation of the blue spectral range 19A can be converted by the converter material to light of a spectral range with longer wavelengths, e.g. into light of the green 19B or red 19C spectral range. For example, the light of the blue spectral range comprises light with a maximum of its intensity in a range of between about 450 and about 490 nm, light of the green spectral range comprises light with its intensity maximum between about 490 and about 530 nm and light of the red spectral range comprises light with its intensity maximum between about 630 and about 670 nm.

The converter region 3 of FIG. 1 can, for example, be divided into three sub-pixel regions 3A, 3B and 3C.

The sub-pixel region 3A comprises a converter material which converts at least a portion of the radiation 7 into red light resulting in radiation 8A with an enhanced fraction of red light. For example, the blue or/and the green portion of the radiation 7 are converted into red light.

The sub-pixel region 3B comprises a converter material which converts at least a portion of the radiation 7 into green light resulting in radiation 8B with an enhanced fraction of green light. For example, the blue portion of the radiation 7 is converted into green light.

The sub-pixel region 3C comprises a converter material which converts radiation of shorter wavelengths than that of blue light, e.g. violet light to light of the blue spectral range. It is also possible that sub-pixel region 3C comprises no converter material.

Downstream in the direction of radiation 7, filter region 2 is formed over the converter region 3. The filter region 2 comprises at least one kind of filter material which only transmits a certain portion of the radiation 8A, 8B and 8C. The filter region 2 can comprise one or more layers comprising said filter material.

The filter material comprises, for example, pigments which transmit a radiation in a certain spectral range and absorb the remaining radiation, at least for the most part.

Sub-pixel region 2A comprises a filter material which transmits mostly red light 9A. Said red light 9A comprises both the red light portion of the original radiation 7 and the red light produced by the converter material 3A.

Sub-pixel region 2B comprises a filter material which transmits mostly green light 9B. The green light 9B comprises both the green light portion of the original radiation 7 and the green light produced by the converter material 3B.

Sub-pixel region 2C comprises a filter material which transmits mostly blue light 9C. The blue light 9C comprises both the blue light portion of the original radiation 7 and the blue light produced by converter material 3C.

The thusly filtered radiation 9A, 9B and 9C is transmitted by the substrate 1. That is to say the substrate 1 is for the most part transparent for the wavelengths of this radiation. It is also possible that filter region 2 and/or converter region 3 are part of the substrate 1. This means that at least the filter region 2 can be integrated into the substrate.

The substrate 1 is, for example, a glass plate or a plate based on a polymeric plastic material. For example, the substrate 1 comprises at least one of the following materials: thin glass plates, semiconductor materials, such as silicon, metal foils, such as steel or stainless steel foils, or plastic materials, such as poly(ethylene terephthalate) (PET), poly(butylene terephthalate) (PBT), poly(enthylene naphthalate) (PEN), polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA).

The substrate 1 can be flexible.

Figure 2:
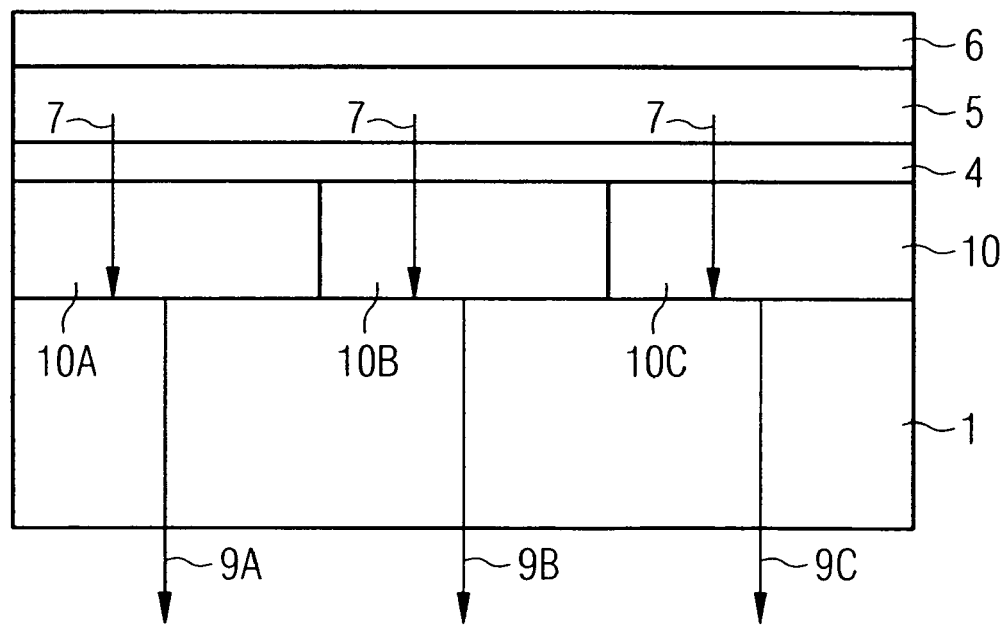
FIG. 2 shows a schematic sectional view of a second exemplary embodiment of an OLED device.

FIG. 2 shows a second exemplary embodiment of the OLED device. In contrast to the embodiment of FIG. 1, the device of FIG. 2 shows a combined filter/converter region 10 which comprises both filter and converter materials. For example, filter and converter materials are admixed into a shared matrix. The matrix comprises, for example, one of the following materials: epoxy resin, silicone resin, acrylate resin, sol-gel materials.

Converter and filter material can be randomly mixed into the matrix material. It is also possible that the spatial distribution of filter and converter material is non-uniform. For example, nearer to the active region 5 the concentration of converter material can be higher than the concentration of filter material. The concentration of converter material can drop in the direction of the radiation 7 whereas the concentration of filter material rises in this direction. Filter and converter material can be chosen, for example, from the materials given in connection with the embodiment of FIG. 1.

Sub-pixel region 10A of the combined filter/converter region 10 comprises a converter material which converts at least a portion of radiation 7, for example, light of the blue and/or green spectral range to light of the red spectral range. Furthermore, sub-pixel region 10A comprises a filter material which mostly transmits red light. As a result, red light 9A is emitted from sub-pixel region 10A.

Sub-pixel region 10B of the combined filter/converter region 10 comprises a converter material which converts at least a portion of the radiation 7, for example light of the blue spectral range to light of the green spectral range. Furthermore, sub-pixel region 10B comprises a filter material which mostly transmits green light. Consequently, sub-pixel region 10B emits green light 9B.

Sub-pixel region 10C either comprises a converter material which converts radiation of certain wavelengths to light in the blue spectral range and a filter material which mostly transmits blue light or the sub-pixel region 10C only comprises such a filter material. Thus the sub-pixel region 10C emits light of the blue spectral range 9C.

FIG. 3 shows a third exemplary embodiment of the OLED device. In contrast to the embodiment described in connection with FIG. 1, radiation is not transmitted through the first electrode 4 and the substrate 1 but through the second electrode 6. Converter region 3 and filter region 2 are formed over the second electrode 6.

In this embodiment second electrode 6 is at least mostly transparent for the radiation produced in active region 5. This can, on the one hand, be accomplished by a second electrode 6 which functions as an anode. In this case a transparent anode material as described above, e.g. ITO can be used for forming the second electrode 6. On the other hand, it is possible that second electrode 6 functions as a cathode. In this case a transparent cathode has to be formed over the active region 5. For example, the transparent cathode comprises an especially thin layer comprising at least one of the cathode materials given in connection with the exemplary embodiment described in FIG. 1. The cathode can be between 1 and 10 nm thick, more preferably between 2 and 3 nm. The cathode is thin enough to be at least semitransparent for the radiation 7 produced in the active region 5.

In the embodiment of FIG. 3 it is also possible that substrate 1 or first electrode 4 are reflective for radiation 7. For example, the first electrode 4 can comprise one or more additional reflective layers such as 4 to 5 nm thick aluminum or silver layers. It is also possible that the substrate consists of a reflective material like metal foil which comprises, for example, stainless steel.

FIG. 4 shows a fourth embodiment of the OLED device. As in the embodiment of FIG. 3, radiation is emitted through the second electrode 6 which is formed over the side of the active region 5 opposite to the substrate 1. Similar to the embodiment of FIG. 2, converter and filter material are mixed into a common matrix resulting in a combined converter/filter region 10.

Figure 6:
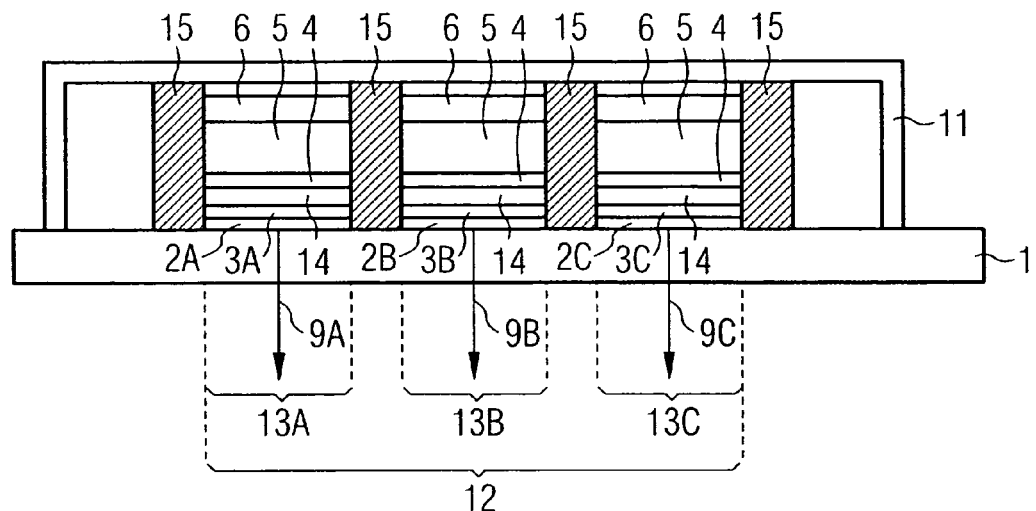
FIG. 6 shows a schematic sectional view of a fifth exemplary embodiment of the OLED device.

FIG. 6 shows a fifth embodiment of the OLED device with red 13A, green 13B and blue 13C sub-pixels similar to the embodiment of FIG. 1.

The sub-pixels 13A, 13B and 13C are separated by bank structures 15. The three sub-pixels form one pixel 12 whereby the OLED device can comprise a plurality of such pixels 12, e.g. arranged in a matrix-like fashion (only one such pixel 12 is shown in FIG. 6).

The bank structures 15 comprise, for example, a photoresist material such as polymide or polysiloxane. The photoresist material can be either positive photoresist material or negative photoresist material. The bank structures 15 are insulating structures that electrically isolate one sub-pixel from another. The bank structures 15 are patterned by applying lithography techniques to the photoresist material or by using screen printing or flexoprinting to deposit the bank material in the desired pattern.

In contrast to the embodiment of FIG. 1, at least one switching element 14 can be applied adjacent to the first electrode 4, e.g. between the first electrode 4 and the filter region 3. With the switching element 14 it is possible to actively switch each sub-pixel and to apply a controllable current to the sub-pixel. Each switching element 14 comprises, for example, at least one thin film transistor (TFT). The integration of TFTs and OLEDs is described, for example, in C. C. Wu et al., "Integration of Organic LED's and Amorphous Si TFT's onto Flexible and Lightweight Metal Foils Substrates", IEEE Electronic device letters, Vol. 18, 12, pp. 609-612, (1997), which is hereby incorporated by reference.

A cap 11 can be formed over the device for encapsulating the device. The cap 11 may comprise at least one of the following materials: metal, glass.

Figure 7:
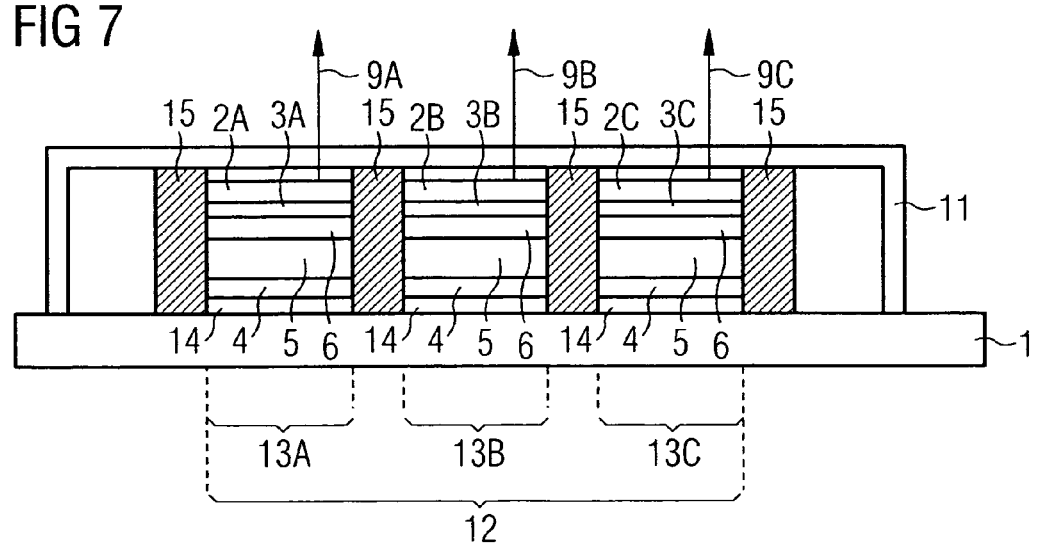
FIG. 7 shows a schematic sectional view of a sixth exemplary embodiment of an OLED device.

FIG. 7 shows a sixth embodiment of the OLED device. In contrast to the embodiment given in FIG. 6, the radiation in this embodiment is emitted through the second electrode 6 and cap 11. The cap 11 can be at least for the most part transparent for the radiation 9A, 9B and 9C emitted by the sub-pixels. In this embodiment, switching elements 14 can be formed over substrate 1 between substrate 1 and first electrode 4. It is further possible that the switching elements 14 are an integral part of substrate 1. Furthermore, it is possible that in this embodiment at least the filter region 2 or filter region 2 and converter region 3 are an integral part of the cap 11.

The scope of the invention is not limited to the examples given herein above. The invention is embodied in each novel characteristic and each combination of characteristics which particularly includes any combination of the features which are described in the claims even if this feature or this combination of features is not explicitly referred to in the claims or in the examples.

I claim:

1. An organic light-emitting device (OLED) comprising:
   an organic active region which emits electromagnetic radiation, wherein the organic region comprises a white-light emitting organic material, said organic material comprising a polymer which emits radiation in the blue spectral range, wherein blue, red and green-emitting chromophors are covalently bonded to the blue emitting polymer,
   a conversion material which converts a portion of the radiation into light of a certain spectral range; and
   a filter material which transmits said light.

2. The OLED device according to claim 1, in which said light is light of the red spectral range.

3. The OLED device according to claim 2, in which said portion of radiation is light of the blue spectral range.

4. The OLED device according to claim 2, in which said portion of radiation is light of the green spectral range.

5. The OLED device according to claim 1, in which said light is light of the green spectral range.

6. The OLED device according to claim 5, in which said portion of radiation is light of the blue spectral range.

7. The OLED device according to claim 1, comprising a plurality of pixels.

8. The OLED device according to claim 7 in which each pixel comprises at least two sub-pixels.

9. The OLED device according to claim 8, in which at least one of said sub-pixels emits light of the red spectral range.

10. The OLED device according to claim 8 in which at least one of said sub-pixels emits light of the green spectral range.

11. The OLED device according to claim 8, in which at least one of said sub-pixels emits light of the blue spectral range.

12. The OLED device according to claim 8 in which each sub-pixel comprises:
   a substrate;
   a first electrode formed over the substrate;
   the organic active region formed over the first electrode; and
   a second electrode formed over the organic region.

13. The OLED device according to claim 12 in which the converter material is located between said substrate and said first electrode.

14. The OLED device according to claim 12 in which the filter material is located between said substrate and said first electrode.

15. The OLED device according to claim 13, in which the filter material is located between said substrate and said converter material.

16. The OLED device according to claim 12, in which the converter material is formed over the second electrode.

17. The OLED device according to claim 12, in which the filter material is formed over the second electrode.

18. The OLED device according to claim 16 in which the filter material is formed over the converter material.

19. The OLED device according to claim 12 wherein the converter material and the filter material are mixed to form a combined filter/converter region.

20. The OLED device according to claim 19, in which the matrix material is located between said substrate and said first electrode.

21. The OLED device according to claim 19, in which the matrix material is formed over the second electrode.

22. The OLED device according to claim 12 in which each sub-pixel comprises a switching element.

23. The OLED device according to claim 22 in which the switching element comprises a thin film transistor.

24. The OLED device according to claim 1, wherein the converter material and the filter material are mixed to form a combined filter/converter region.

* * * * *